US006208454B1

(12) United States Patent
Koren et al.

(10) Patent No.: US 6,208,454 B1
(45) Date of Patent: Mar. 27, 2001

(54) ALL-OPTICAL MACH-ZEHNDER WAVELENGTH CONVERTER WITH MONOLITHICALLY INTEGRATED LASER

(76) Inventors: Uziel Koren, 26 Forrest Ave., Fair Haven, NJ (US) 07704; Leonard Henri Spiekman, 60 County Rd. Unit K-53, Cliffwood, NJ (US) 07721; Jay M. Wiesenfeld, 15 Oak St., Lincroft, NJ (US) 07738

( * ) Notice: Subject to any disclaimer, the term of this patent is extended or adjusted under 35 U.S.C. 154(b) by 0 days.

(21) Appl. No.: 08/997,204

(22) Filed: Dec. 23, 1997

(51) Int. Cl.[7] .................................. G02F 1/35; G02F 2/02
(52) U.S. Cl. ........................ 359/326; 359/124; 359/332
(58) Field of Search ........................... 359/124, 326–327, 359/332

(56) References Cited

U.S. PATENT DOCUMENTS 5,978,129 * 11/1999 Jourdan et al. .................... 359/326
6,005,708 * 12/1999 Leclerc et al. .................... 359/326

FOREIGN PATENT DOCUMENTS

08334796 * 12/1996 (JP) .

OTHER PUBLICATIONS

Danielsen et al., "Wavelength converters: network applications and systems experiments", Lasers and Electro–Optics, 1997. CLEO '97, vol: 11, pp. 26–26.*
Vodjdani et al., "Integrated Optics interferometric devices with Semiconductor Optical Amplifiers for wavelength conversion", Lasers and Electro–Optics Society Annual Meeting, 1995. 8th Annual Meeting Conference Proceedings, vol. 1., IEEE. pp. 243–244.*

* cited by examiner

*Primary Examiner*—Kinfe-Michael Negash

(57) ABSTRACT

A wavelength converter incorporating an on-chip integrated laser for use in an optical system. The converter includes a first port for receiving an optical input signal such as a WDM signal and providing it to an interferometer, and an output port for outputting a signal which is a wavelength-converted version of the input signal. An optical source or laser is fabricated on the chip substrate on which the interferometer is formed for providing operating power to the interferometer. Power levels of the input signal are maintained by adjusting an on-chip semiconductor optical amplifier that receives the optical input signal and provides the amplified signal to the interferometer. In an alternative embodiment, the on-chip optical source is replaced by an on-chip preamplifier for an external laser source.

9 Claims, 6 Drawing Sheets

ALL-OPTICAL MACH-ZEHNDER WAVELENGTH CONVERTER WITH MONOLITHICALLY INTEGRATED LASER

BACKGROUND OF THE INVENTION

I. Field of the Invention

The present invention relates to a wavelength converter for use in wavelength division multiplexed optical communications systems. More particularly, the present invention is directed to an interferometer wavelength converter having an integrated continuous wave probe source and/or integrated optical pre-amplifier(s).

II. Description of the Related Art

Wavelength division multiplex (WDM) networks benefit from the flexibility of wavelength converters due to the reduction in network blocking probability that such converters provide and because wavelength conversion at selected nodes in the network enables decentralized wavelength allocation management. One of the most-practical all-optical wavelength conversion schemes is cross-phase modulation in an interferometric configuration containing semiconductor optical amplifiers (SOA). Essentially, such a configuration consists of a three-port interferometer device, such as a Michelson or Mach-Zehnder interferometer, wherein an input optical signal is provided to a first port, a continuous wave beam from a light source such as a laser is provided to a second port, and an output signal is generated from a third port. The wavelength of the input optical signal is converted to the wavelength of the light source and is delivered, as so converted, from the third port of the device. The benefits of such a wavelength conversion scheme include conversion efficiency, extinction ratio enhancement and low chirp characteristics. However, it suffers from coupling losses resulting from coupling the continuous wave input to the interferometer, and from polarization variations of the continuous wave input. Furthermore, its input signal dynamic range, i.e., the range of input signal powers that is acceptable, is fairly small, typically 3 or 4 dB.

A goal of the present invention is to ameliorate the disadvantages, while retaining the benefits of an interferometric design. This is accomplished by monolithic integration, i.e. fabrication on the same chip of an interferometer, a continuous wave laser, and a pre-amplifier for the input signal. By the very nature of monolithic integration, such a fabrication removes the need for a fiber connection between the continuous wave laser and the interferometer, and therefore diminishes coupling losses between these components. The preamplifier not only provides gain, but also allows controlled gain for adjusting the input signal power available to the power required by the interferometer.

SUMMARY OF THE INVENTION

The present invention is directed to a device for converting an optical signal having a wavelength and translating a data signal to a different wavelength. The inventive device includes a first port for receiving the optical signal and an interferometer having first and second branches, receiving the optical signal at one of those branches. A continuous wave optical power source, such as a DFB laser, is formed on a common substrate with the interferometer. The laser provides optical power to the interferometer at a particular wavelength and, in use, the wavelength of the optical signal is converted by the interferometer to the wavelength of the optical power source. The resulting optical signal can then be output on an optic fiber.

In a preferred embodiment, a semiconductor optical amplifier is also formed on the substrate with the interferometer and laser. The amplifier enables adjustment of the optical signal power so that it remains within the operating range of the interferometer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE PRESENTLY PREFERRED EMBODIMENTS

Figure 1:
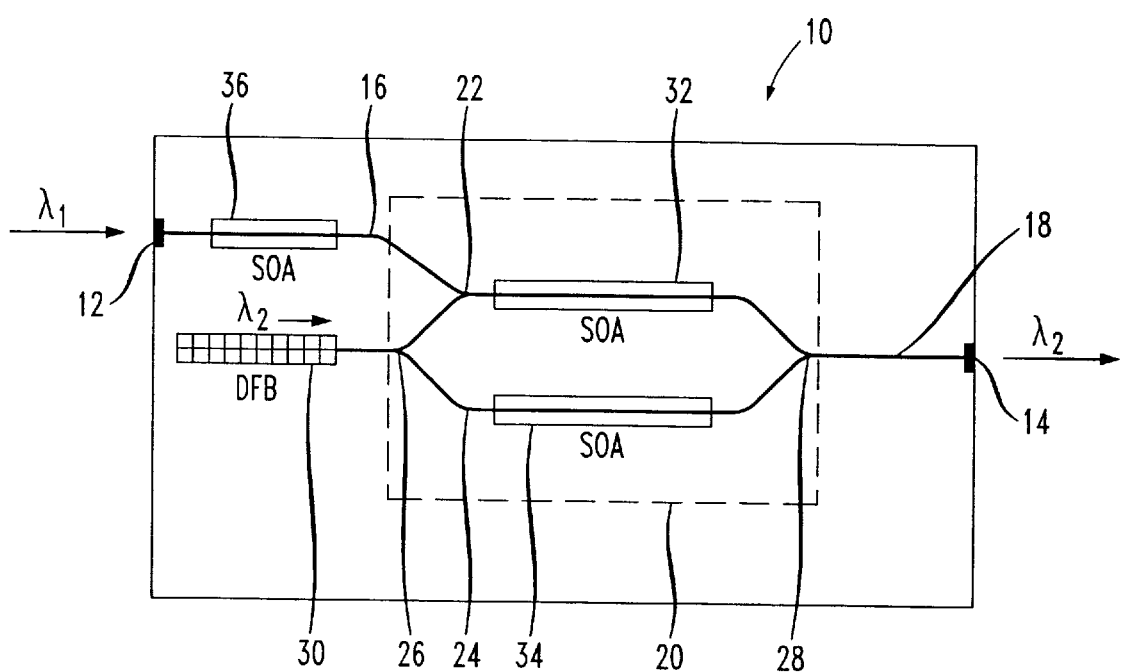
FIG. 1 is a diagrammatical representation of an interferometer wavelength conversion device in accordance with the present invention.

With reference to FIG. 1, a wavelength converter device 10 having an integrated (on-chip) laser in accordance with the present invention is there depicted. As shown, the device contains an input port 12 for receiving an optical data signal $\lambda_1$, and an output port 14 for outputting a signal $\lambda_2$. Output signal $\lambda_2$ contains the data information of input signal $\lambda_1$ and is shifted or converted to a different wavelength (e.g. $\lambda_2$) by the device 10. An on-chip interferometer 20, such as a Mach-Zehnder interferometer, is connected between the input port 12 and the output port 14 via an input waveguide 16 that provides input signal $\lambda_1$ to the interferometer, and an output waveguide 18 that carries $\lambda_2$ to output port 14.

As shown in FIG. 1, interferometer 20 has a first branch 22 and a second branch 24 having a common input terminal 26 and a common output terminal 28, with each branch containing a respective semiconductor optical amplifier 32, 34. As is well known to those having ordinary skill in the art, interferometer 20 operatively performs constructive and destructive interference at the output 28 of signals provided to its input 26, depending on the phase difference between the branches.

The inventive device 10 further includes an integrated on-chip optical source, such as a distributed feedback (DFB) continuous wave source or laser 30, connected to the input terminal 26 of the interferometer 20 to provide optical power at a given wavelength ($\lambda_2$) for interferometer operation. In a preferred embodiment, laser 30 is a 1/4-wave shifted DFB laser. The optical power signal generated by laser 30 is divided between the first and second branches 22, 24 of the interferometer, as is known in the art. By applying the input signal $\lambda_1$ to one of the branches (e.g. the first branch 22), stimulated emission caused by input signal $\lambda_1$ reduces the carrier density within the semiconductor optical amplifier (e.g. 32), which causes a change in the optical path length of that branch, resulting in a change in the output power of the signal $\lambda_2$ at the output 28 of the interferometer 20.

As is known by those having ordinary skill in the art, Mach-Zehnder interferometers require a $\pi$ phase difference between their arms for complete switching. This $\pi$ phase shift is achieved for a particular input power level of the signal at $\lambda_1$ at port 16, which depends on the operating and manufacturing details of the interferometer 20 and input waveguide 16. In the three-port prior art wavelength conversion device discussed above, the operation of the Mach-Zehnder interferometer 20 is therefore susceptible to variations in the power of the input signal $\lambda_1$. Thus, as the input signal power varies, the Mach-Zehnder interferometer requires continuous adjustment for proper system operation, as for example by adjusting the electrical bias current to semiconductor optical amplifiers 32 or 34, to compensate for variation in the input data signal power. In order to compensate for variations in input signal power a semiconductor optical amplifier 36 is preferably provided on input waveguide 16 between input port 12 and first branch 22. The semiconductor optical amplifier 36 enables dynamic adjustment of the power of the input signal $\lambda_1$ to the appropriate operating range of the Mach-Zehnder interferometer 20 by variation of its electrical bias current. It has been discovered that by incorporating the semiconductor optical amplifier 36 at the input port 12, the Mach-Zehnder operating range can be advantageously extended to accommodate lower power levels.

The device 10 may be fabricated using well-known fabrication techniques, such as photonic integration processes from a standard MOVPE-grown wafer containing multiple quantum-well active layers formed on a passive InGaAsP waveguide core, as has been used to fabricate test devices. The quantum wells consist of an optimized compressively/tensile strained stack to provide polarization independent gain. The gratings in the DFB laser 30 are preferably formed by phasemask printing, thus enabling the fabrication of devices emitting many different wavelengths on a single wafer. The quantum wells are etched away in the passive sections before waveguide formation.

In the test device, the threshold of the DFB laser was typically 20–30 mA. At a biasing of 60 mA, a photocurrent exceeding 1 mA in both SOAs in the interferometer 20 was detected, indicating at least 0 dBm of optical power delivered to each SOA. On the test wafer, DFB lasers are available with ten different output wavelengths spaced by 200 GHz. All experiments described below were carried out with a DFB laser emitting at 1568.7 nm.

Figure 2:
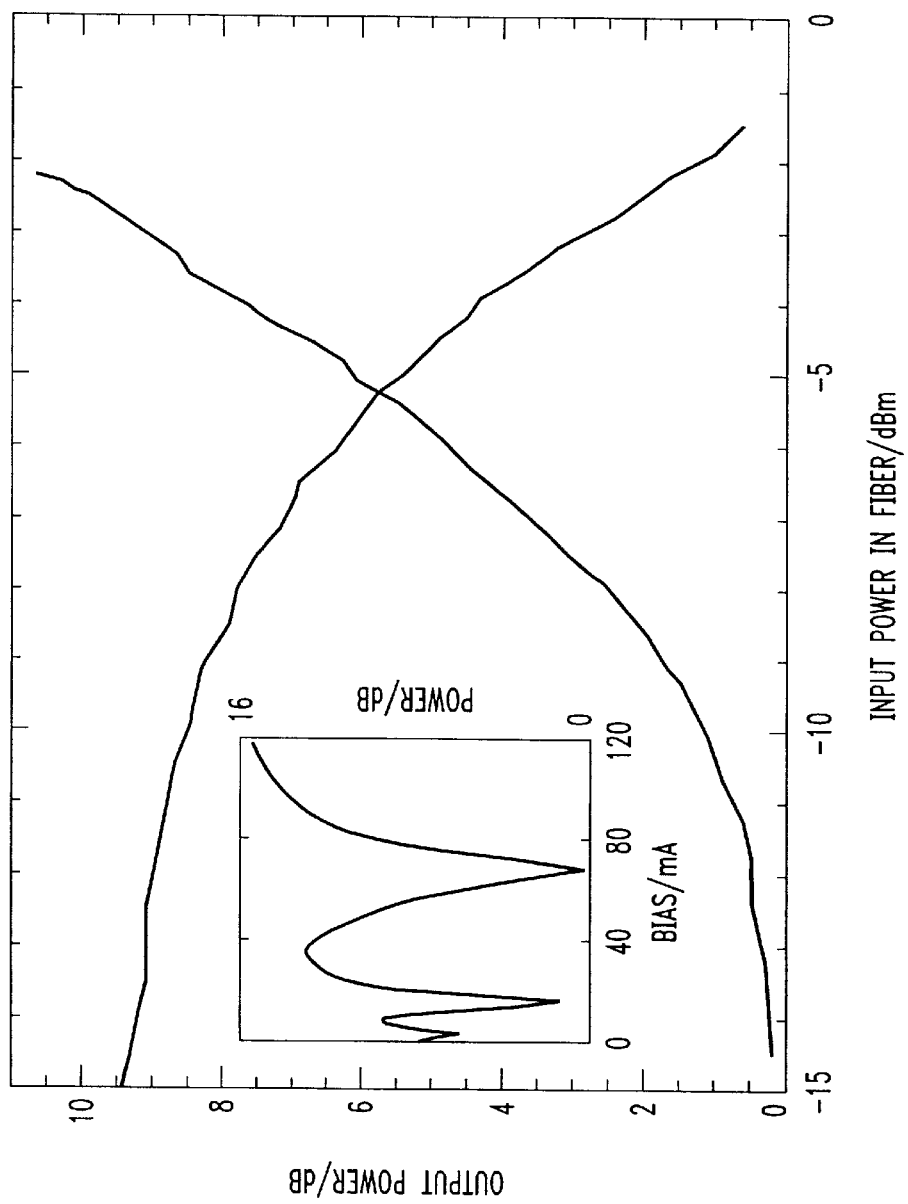
FIG. 2 shows optical switching curves, and, in the inset, an electrical switching curve for the inventive conversion device.

An electrical switching curve for the device 10 is shown in the inset in FIG. 2. The data in this figure correspond to measured output power at the converted wavelength, for a fixed bias on SOA 32 of 100 mA, and a variable bias on SOA 34 as shown on the horizontal axis. No input signal at $\lambda_1$ is present.

For optically switched operation, the bias point was chosen at a minimum or at a peak of the electrical switching curve, for positive or inverting operation, respectively. This exact point is influenced by amplified spontaneous emission from the pre-amplifier 36. The balance of the device 10 was switched optically by driving the input 12 with a modulated signal at $\lambda_1$, thereby removing carriers in the input SOA 32 and effectively moving to the left along the switching curve (FIG. 2). The normally-off (non-inverting) configuration provides a large extinction ratio and is known to give more desirable chirp performance in combination with transmission over standard dispersion optical fiber, so this operation of the device was demonstrated for dynamic experiments. The input signal was coupled to the device using a fiber microlens, and the power levels powers shown were measured in the fiber.

Figure 3:
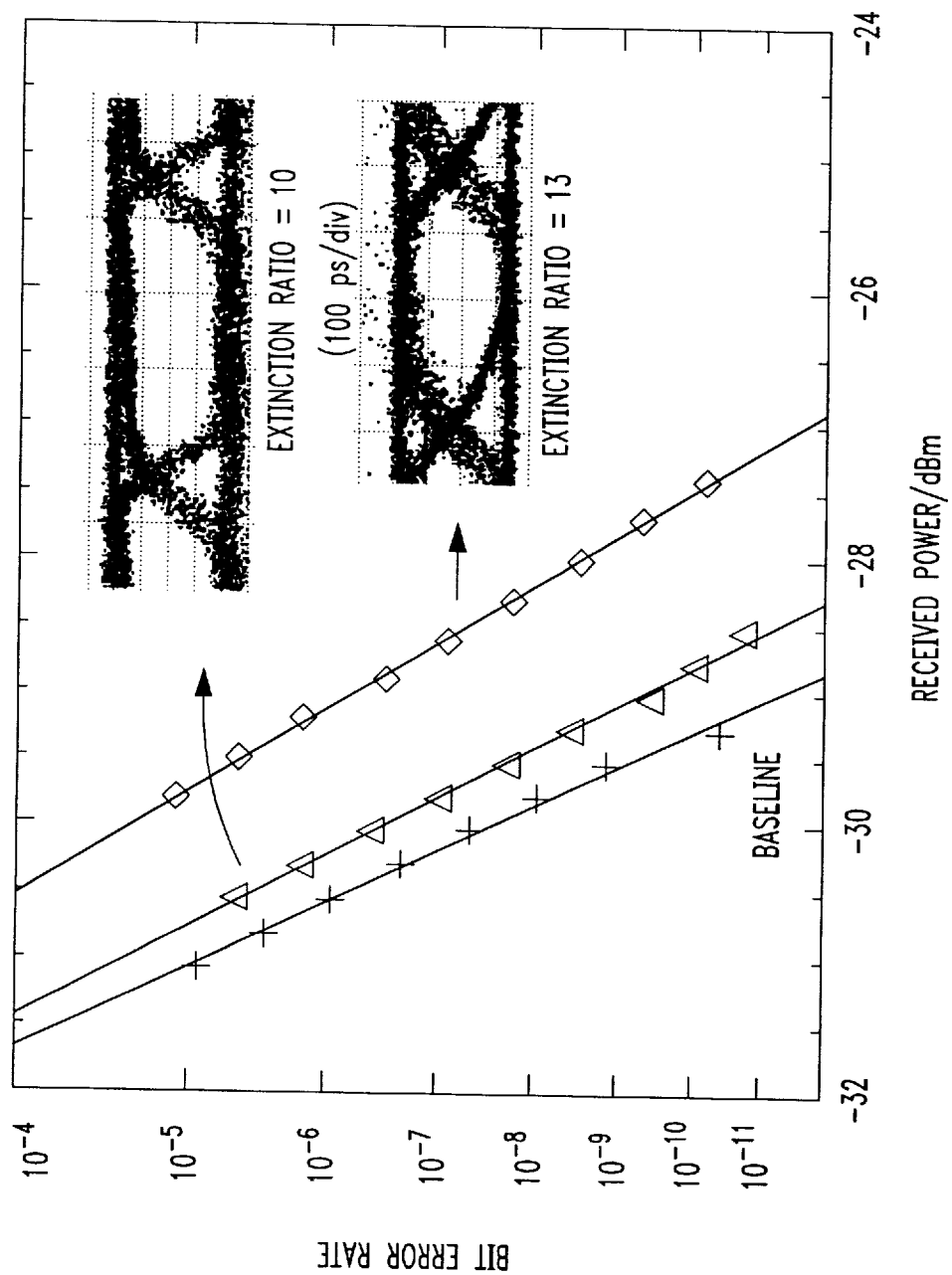
FIG. 3 depicts bit error rate curves of the inventive conversion device for a pseudo random bit sequence of a particular length and over a selected wavelength range.

Bit error rate curves for conversion of a pseudo random bit sequence (PRBS) of length $2^{23}-1$ from 1559 nm to 1568 nm are shown in FIG. 3. When the device 10 was optimized for a maximum output extinction ratio (11 dB), a penalty of 1.6 dB was measured at a BER of $10^{-9}$. The eye diagram in the lower inset in FIG. 3 shows that this penalty is mainly caused by ISI due to rather slow gain dynamics in the SOA, which was driven with a moderate bias of 100 mA. Rather than risking amplified back-reflections into the DFB 30 by increasing this bias, the switching speed was increased by setting the bias point of the device 10 slightly above the minimum in the electrical switching curve (68 mA in FIG. 2), and driving the interferometer 20 slightly more than $\pi$ phase shift between the off and on states. This reduced the extinction ratio to 10 dB but significantly enhanced the switching speed, as shown by the eye diagram in the upper inset of FIG. 3. It also reduced the conversion penalty to 0.6 dB, as shown.

By virtue of the input pre-amplifier 36, input powers in the fiber as low as −5.4 dBm could be accommodated without additional conversion penalty. An average output power of 2 dBm was coupled into a lensed fiber, which yielded a fiber to fiber conversion gain of up to 7.5 dB. An input signal power of −8.5 dBm incurred an extra 1 dB penalty. Because the SOAs formed on-chip have slightly less gain for transverse magnetic (TM) polarization as compared to transverse electric (TE) polarization, a polarization dependent penalty of 0.6 dB was measured. (This is not fundamental to the device.)

Figure 4:
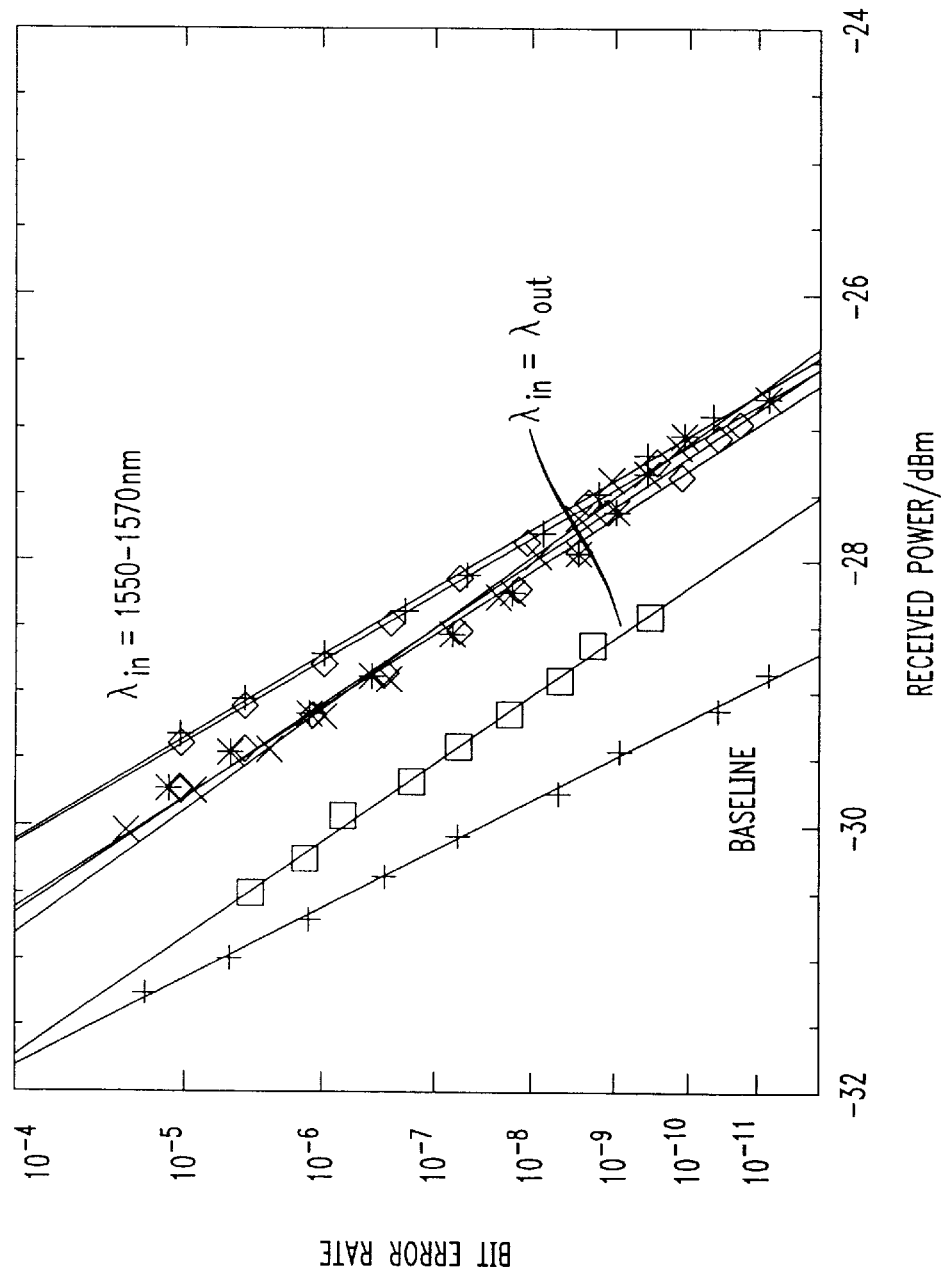
FIG. 4 graphically illustrates wavelength-dependent conversion results for a selected wavelength range.

Wavelength-dependent conversion results are shown in FIG. 4. Conversion of input signals in the range 1550–1570 nm to 1568.7 nm, optimized for highest extinction ratios, yielded similar penalties to the ones depicted in FIG. 3. The pattern length was $2^{23}-1$, and the same settings were used for the device 10 biases for all measurements. An increased input power of 1 dB (or a slightly higher preamp bias) was needed for input wavelengths of 1550 and 1570 nm to compensate for the roll-off at the extremes of the SOA gain spectrum.

When conversion to the same wavelength (i.e., $\lambda_1=\lambda_2$) is desired, special steps must be taken since the signal and carrier cannot, in this case, be separated by filtering. This situation is handled by turning "off" the DFB laser 30 and the SOA 34 in the lower interferometer arm 24 (see FIG. 1) and thus allowing the input signal to pass straight through two SOAs. The bias of the input pre-amplifier should be reduced to avoid excessive gain compression in the Mach-Zehnder SOA 32, which has otherwise been seen to distort the eye pattern and result in a penalty of over 3 dB relative to baseline. With this bias reduction, a clean eye was produced and the penalty was 0.7 dB.

The phase change associated with switching the Mach-Zehnder from "on" to "off" or vice versa should also be detectable at the output in the form of chirp. The magnitude of this chirp, as described by the linewidth enhancement factor $\alpha$, is determined from the ratio of the phase and amplitude modulation indices: $\alpha=-2(\beta/m)$. To measure $\alpha$, device 10 is set for non-inverting operation in the absence of input signal at $\lambda_1$, and then a signal partly modulated with a 5 GHz sine wave is input to port 12. This results in a similar sinusoidal modulation at the output wavelength. The amplitude modulation index m is measured in the time domain using a fast PIN photodiode and an oscilloscope to measure the temporal output, and the phase modulation index β is determined from the ratio of the strength of the first spectral sidebands to the strength of the carrier as measured using a scanning Fabry-Pérot etalon.

Figure 5:
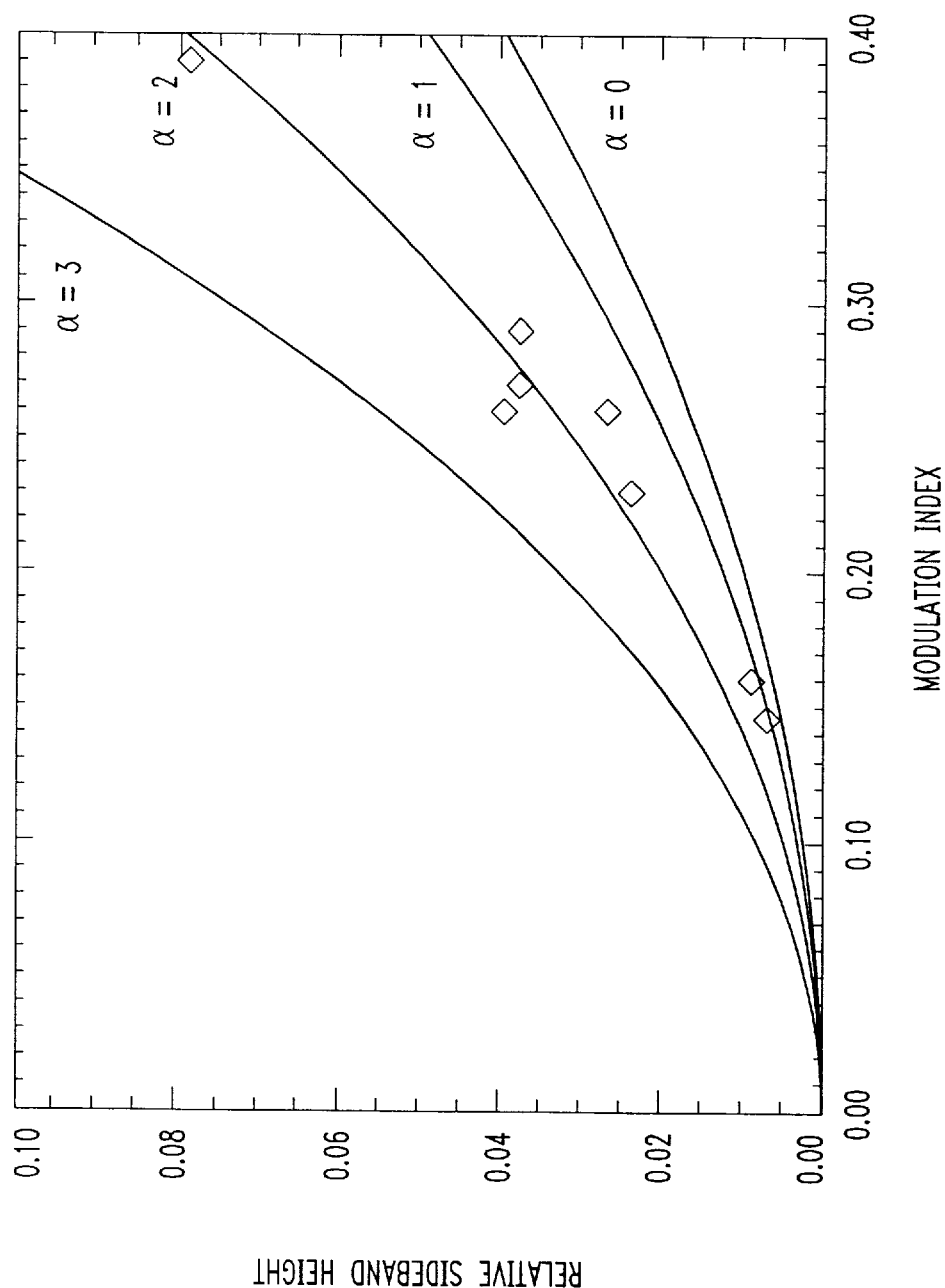
FIG. 5 is a plot of the sideband strengths for a number of modulation indices, along with calculated curves for a number of chirp factor values.

In FIG. 5, the sideband strengths are plotted for a number of modulation indices, along with calculated curves for a number of values of α. In the experimental device, α=2±0.5, which is very low compared to typical measured values of 7 to 11 for wavelength conversion devices utilizing cross gain modulation. This low value is obtained because only a π phase shift is required to switch the interferometer 20 from completely "off" to completely "on" or vice versa. The sign of α is known to be negative for non-inverting conversion, which enhances the transmission distance over standard dispersive fiber, compared to information-bandwidth limited signals.

In summary, the device 10 of the present invention, i.e. an interferometric wavelength converter with an integrated on-chip continuous wave source, has been shown to convert signals at a bitrate of 2.5 Gb/s with a penalty of less than 1 dB both for conversion and for same-wavelength operation. Input signal bandwidth is 20 nm, centered at 1560 nm. The device exhibits minimal polarization dependence, and converts a wide range of input powers as low as −5.4 dB (in the fiber before coupling to the device). A measured α-factor of 2 for conversion operation indicates advantageously small chirp behavior. For same-wavelength operation, no chirp is added to the input signal.

The device described here emits at an output wavelength of 1568.7 nm. The functionality of the device can be extended to variable output wavelength operation by replacing the integrated DFB laser 30 with an array of single frequency lasers or a tunable laser.

Figure 6:
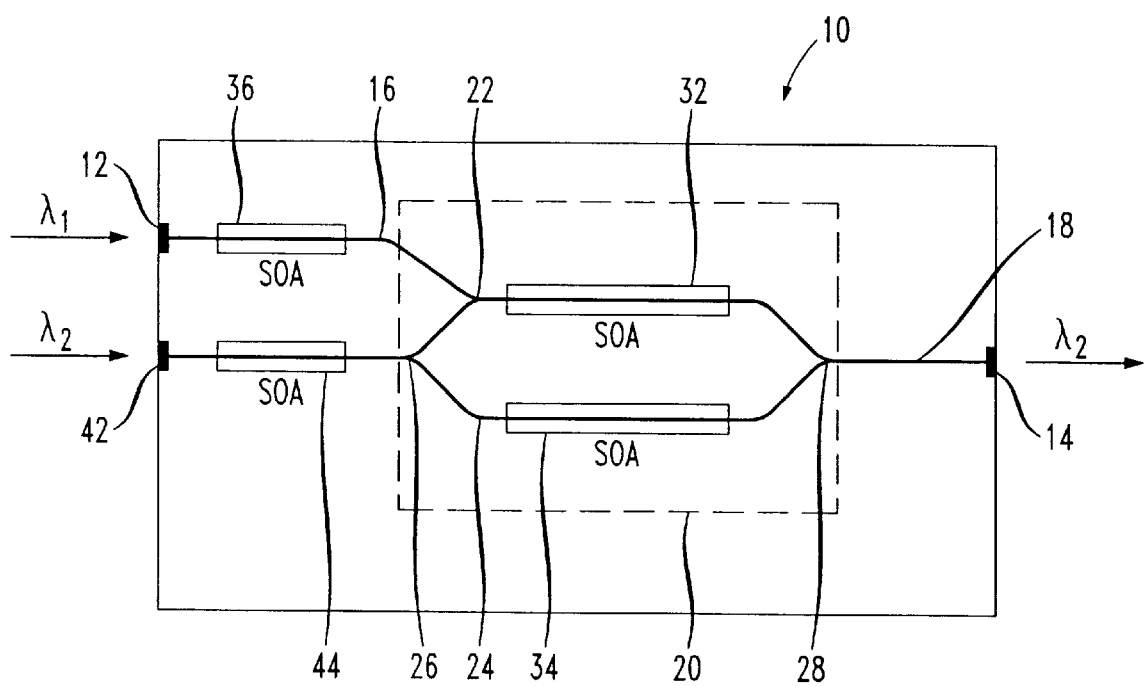
FIG. 6 is a schematic representation of an alternative embodiment of the conversion device of FIG. 1.

In an alternative embodiment of the device 10, laser 30 is replaced by an input branch containing a pre-amplifier 44 positioned at an input port 42, as shown in FIG. 6. Instead of low loss coupling between the laser and the interferometer (which is present in FIG. 1), the losses at input port 42 are now compensated by the pre-amplifier 44, effectively producing the same results. Now extension to variable output wavelength operation is trivially accomplished by connecting a tunable laser and an isolator (not shown) to input 42.

The technique for integrating a signal pre-amplifier 36 or 44 on the same chip is distinguishable from an all-active interferometer design of the type disclosed in W. Idler et al., Signal Quality and BER Performance Improvement By Wavelength Conversion With An Integrated Three-Port Mach-Zehnder Interferometer, Electronics Letters, Vol.31, no.6. pp.454–455, March 1995, in which the input branch, although in theory capable of providing gain, must be carefully adjusted to transparency for stable operation of the device. This is so because the input branch bias current controls not only the straight section of the input branch, but also the coupler that connects the branch to the interferometer. Furthermore, an all-active design precludes independent optimization of amplifiers and waveguides and since, as the entire device is pumped, a large fraction of the bias current is used in an inefficient way. Therefore, high saturation output power pre-amplifiers are not attainable. Additionally, since electrically isolating sections are needed between those parts of the device that need separate control (e.g. the amplifiers 32, 34 in the arms of the interferometer), short sections of unpumped active waveguide are created which will behave as saturable absorbers, adversely affecting device performance. Those skilled in the art that choose an all-active design might do so by lack of availability of active-passive integration technology, but not with the purpose of providing pre-amplification. The controlled gain can only be provided by a separate pre-amplifier designed for that purpose, as proposed in the present invention.

Extension of the device speed to higher bitrates requires the realization of faster gain recovery times in the interferometer SOA 32. This can be brought about, among others, by increasing the optical power injected into SOA 32. Thus, having an integrated DFB 30, or alternatively a pre-amplifier 44 on-chip is a distinct advantage, since the former diminishes coupling losses and the latter compensates for said losses. Another method is to emphasize higher frequency components in the input signal by high pass filtering it prior to injection in the interferometer. This is an additional feature that can be accomplished by pre-amplifier 36.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A wavelength converter for converting to an output wavelength an input optical signal having varying input signal power, an input wavelength and carrying a data signal so that the data signal is essentially unaffected by the conversion, comprising:

first port for receiving the input optical signal;

an interferometer formed on a substrate and having first and second branches for receiving the input optical signal at one of said branches, each of said branches having a semiconductor optical amplifier;

an optical power source formed on said substrate with said interferometer for providing optical power to said interferometer at the output wavelength so that the optical power is provided to said first and second branches for converting the input wavelength of the input optical signal to the output wavelength;

an input semiconductor optical amplifier disposed between said first port and said one of said branches for adjusting the varying input signal power prior to said input signal being provided to said one of said branches; and an output port for outputting the converted optical signal to an output fiber.

2. The converter of claim 1, wherein said power source comprises a distributed feedback laser.

3. The converter of claim 1, wherein said interferometer comprises a Mach-Zehnder interferometer.

4. The converter of claim 3, wherein said Mach-Zehnder interferometer is operable over an optical power range, and wherein said input semiconductor optical amplifier is adjusted for regulating the power level of the input optical signal to be within said optical power range.

5. The converter of claim 1, wherein the power source comprises an array of single wavelength lasers.

6. The converter of claim 1, wherein said power source comprises a tunable laser.

7. A wavelength converter for converting to an output wavelength an input optical signal having varying input signal power, an input wavelength and carrying a data signal so that the data signal is essentially unaffected by the conversion, comprising:

a first port for receiving the input optical signal;

an interferometer formed on a substrate and having first and second branches for receiving the input optical signal at one of said branches, each of said branches having an optical power amplifier;

an input semiconductor optical amplifier disposed between said first port and said one of said branches for adjusting the varying input signal power prior to said input signal being provided to said one of said branches;

a second port for receiving an optical power signal having the output wavelength;

an optical power signal amplifier formed on said substrate with said interferometer and connected between said second port and said interferometer for amplifying the optical power signal for providing optical power to said interferometer at the output wavelength so that the optical power is provided to said first and second branches for converting the input wavelength of the input optical signal to the output wavelength; and an output port for outputting the converted optical signal to an output fiber.

8. The converter of claim 7, wherein said interferometer comprises a Mach-Zehnder interferometer.

9. The converter of claim 8, wherein said Mach-Zehnder interferometer is operable over an optical power range, and wherein said input semiconductor optical amplifier is adjusted for regulating the power level of the input optical signal to be within said optical power range.

* * * * *

UNITED STATES PATENT AND TRADEMARK OFFICE
CERTIFICATE OF CORRECTION

PATENT NO. : 6,208,454 B1
DATED : March 27, 2001
INVENTOR(S) : Uziel Koren et al.

It is certified that error appears in the above-identified patent and that said Letters Patent is hereby corrected as shown below:

Title page,
Insert Item [73] to read:
AGERE SYSTEMS OPTOELECTRONICS GUARDIAN CORP.
14645 N.W. 77th Avenue
Miami Lakes, Florida 33014
      and
AT&T CORP.
32 Avenue of the Americas
New York, New York 10013

Signed and Sealed this

Eleventh Day of December, 2001

Attest:

NICHOLAS P. GODICI
Attesting Officer    Acting Director of the United States Patent and Trademark Office